(12) United States Patent
Kitamura et al.

(10) Patent No.: US 8,189,320 B2
(45) Date of Patent: May 29, 2012

(54) CAPACITATIVE ELEMENT

(75) Inventors: Ken Kitamura, Kanagawa (JP); Motoyasu Yano, Kanagawa (JP)

(73) Assignee: Sony Corporation, Tokyo (JP)

( * ) Notice: Subject to any disclaimer, the term of this patent is extended or adjusted under 35 U.S.C. 154(b) by 357 days.

(21) Appl. No.: 12/458,893

(22) Filed: Jul. 27, 2009

(65) Prior Publication Data

US 2010/0061035 A1 Mar. 11, 2010

(30) Foreign Application Priority Data

Sep. 8, 2008 (JP) ............................... P2008-229363

(51) Int. Cl.
*H01G 4/00* (2006.01)

(52) U.S. Cl. ............... 361/301.4; 361/303; 361/313; 361/311; 361/321.2; 361/328

(58) Field of Classification Search ............... 361/301.4, 361/303, 313, 321.2, 328; 257/307, 532, 257/296, 308
See application file for complete search history.

(56) References Cited

U.S. PATENT DOCUMENTS

| 6,356,429 | B2 * | 3/2002 | Hayashi | 361/303 |
| 6,949,781 | B2 * | 9/2005 | Chang et al. | 257/307 |
| 6,963,122 | B1 * | 11/2005 | Soenen et al. | 257/532 |
| 7,327,551 | B2 * | 2/2008 | Chien et al. | 361/301.2 |
| 2007/0090429 | A1 * | 4/2007 | Chien et al. | 257/296 |
| 2007/0278551 | A1 | 12/2007 | Anthony | |
| 2010/0038752 | A1 * | 2/2010 | Ng et al. | 257/532 |

FOREIGN PATENT DOCUMENTS

| JP | 2005-108874 A | 4/2005 |
| JP | 2006-303220 A | 11/2006 |
| JP | 2009-540541 T | 11/2009 |
| WO | WO-2007/143153 A1 | 12/2007 |

OTHER PUBLICATIONS

Japanese Office Action issued Jul. 27, 2010 for corresponding Japanese Application No. 2008-229363.

* cited by examiner

*Primary Examiner* — Nguyen T Ha
*Assistant Examiner* — Hung Dang
(74) *Attorney, Agent, or Firm* — Rader Fishman & Grauer, PLLC

(57) ABSTRACT

Disclosed herein is a capacitative element, including: a first electrode formed on a substrate; and a second electrode provided so as to sandwich a dielectric between the first electrode and the second electrode and so as to surround the first electrode on four sides along a surface of the substrate.

7 Claims, 15 Drawing Sheets

CAPACITATIVE ELEMENT

BACKGROUND OF THE INVENTION

1. Field of the Invention

The present invention relates to a capacitative element which utilizes a wiring formed on a substrate as electrodes.

2. Description of the Related Art

In a semiconductor integrated circuit, a capacitative element which utilizes a wiring formed on a semiconductor substrate as electrodes is devised in various ways. For example, a capacitative element disclosed in Japanese Patent Laid-Open No. Sho 64-084616 (hereinafter referred to as Patent Document 1) has a structure that a first electrode and a second electrode are formed in sinking comb-like shapes, respectively, and layers having the respective sinking comb-like portions, of the first electrodes, engaged with each other through a dielectric are laminated. In this capacitative element, an electrode structure is reversed in such a way that the first electrode and the second electrode face each other in the upper and lower layers.

In addition, Japanese Patent Laid-Open No. 2000-252428 (hereinafter referred to as Patent Document 2) discloses a capacitative element structured in such a way that a first electrode and a second electrode are alternately disposed in a first level, the first electrode and the second electrode are alternatively disposed in a second level so as to cross the first electrode and the second electrode in the first level, and this pattern is repetitively formed. In this case, the first electrodes in the first and the second level, and the second electrodes in the first and second levels are connected to each other through via holes, respectively.

In addition, U.S. Pat. No. 6,690,570 (hereinafter referred to as Patent Document 3) discloses a capacitative element structured in such a way that in each of first and second levels, a first electrode and a second electrode are alternately disposed in the same direction, and in each of the third and fourth levels, the first electrode and the second electrode are alternately disposed in the same direction perpendicularly intersecting with the direction of disposition of the first electrode and the second electrode in each of the first and second levels. In this case, the first electrodes in the first to fourth levels, and the second electrodes in the first to fourth levels are connected to one another through via hoes, respectively.

Also, Japanese Patent Application No. 2005-108874 (hereinafter referred to as Patent Document 4) discloses a capacitative element having such a function that the other electrode is shielded by one electrode. In this capacitative element, a first electrode having a sinking comb-like shape, and a second electrode having another sinking comb-like shape are engaged with each other through a dielectric in a first level, and the first electrode having the sinking comb-like shape is surrounded on outer three sides by the second electrode having another sinking comb-like shape.

Any of the capacitative elements described above has such a structure that a capacitance per unit area is sufficiently obtained while a wiring is utilized.

SUMMARY OF THE INVENTION

However, each of the capacitative elements disclosed in Patent Documents 1, 2, and 3 has the structure that external capacitive coupling is readily added to both the electrodes of the capacitative elements. The external capacitive coupling causes a bad influence exerted on characteristics of an analog circuit. In addition, in the case of the capacitative element described in Patent Document 4, although the shielding structure is formed by the outer second electrode, the sinking comb-like portions of the second electrode are adjacent to one another in a certain level, and thus the capacitance per unit area is lost.

The present invention has been made in order to solve the problems described above, and it is therefore desirable to provide a capacitative element which is capable of sufficiently obtaining a capacitance per unit area while external capacitive coupling is suppressed.

In order to attain the desire described above, according to an embodiment of the present invention, there is provided a capacitative element including: a first electrode formed on a substrate; and a second electrode provided so as to sandwich a dielectric between the first electrode and the second electrode and so as to surround the first electrode on four sides along a surface of the substrate.

According to the embodiment of the present invention, in the first electrode and the second electrode composing the capacitative element, the second element is formed so as to surround the first electrode on four sides. Therefore, the external capacitive coupling can be suppressed based on the shielding effect provided by the second electrode.

In addition, in the embodiment of the present invention, a unit capacitative element is composed of the first electrode and the second electrode, and the plurality of unit capacitative elements are connected to one another along the surface of the substrate, thereby structuring a unit capacitative element layer. Moreover, a plurality of unit capacitative element layers are laminated in a direction vertical to the surface of the substrate.

As a result, the capacitance can be sufficiently obtained per unit area while the shielding effect provided by the second electrode is brought out.

In addition, according to the present invention, the first electrode and a portion of the second electrode which are located inside the unit capacitative element layer are surrounded on four sides along the surface of the substrate by an outermost portion of the second electrode. In addition, a shielding electrode making conduction with the second electrode is formed in at least one of an uppermost layer and a lowermost layer of the unit capacitative element layers.

As a result, it is possible to further enhance the shielding effect provided by the second electrode.

As set forth hereinabove, according to the present invention, it is possible to provide the capacitative element which is capable of sufficiently obtaining the capacitance per unit area while the external capacitive coupling is suppressed in utilizing the wiring formed on the substrate as the electrodes of the capacitative element.

DETAILED DESCRIPTION OF THE PREFERRED EMBODIMENTS

The preferred embodiments of the present invention will be described in detail hereinafter with reference to the accompanying drawings.

Structure of Unit Capacitative Element

Figure 1A:
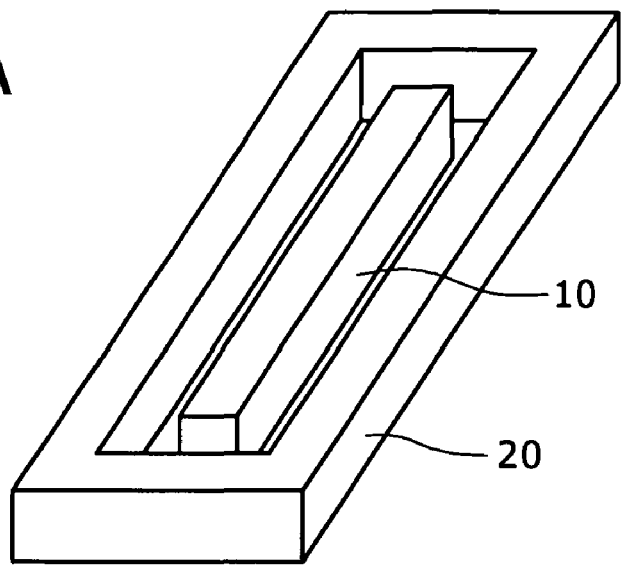
FIGS. 1A to 1C are respectively schematic perspective views showing structures of unit capacitative elements for a capacitative element of the present invention.
Figure 1B:
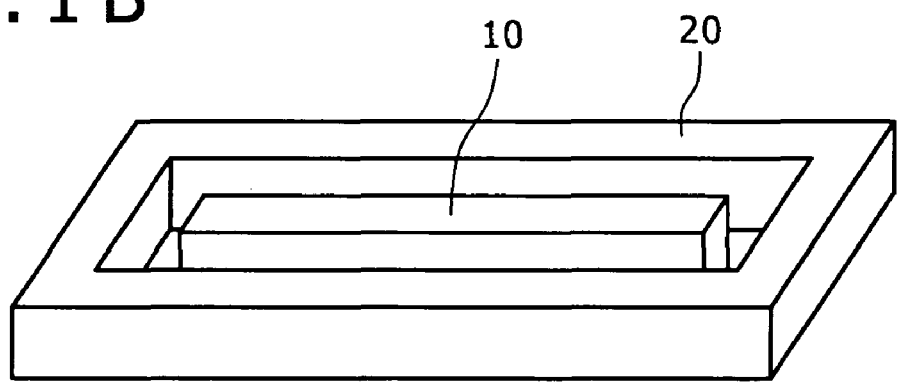
Figure 1C:
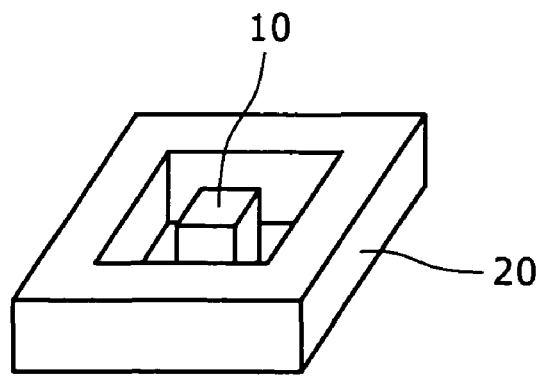

FIGS. 1A to 1C are respectively schematic perspective views showing structures of unit capacitative elements of first to third examples for a capacitative element of the present invention. The capacitative element of the present invention utilizes a wiring firmed on a semiconductor substrate as an example of a substrate as electrodes thereof, and is structured in levels each having a wiring formed therein.

The unit capacitative element has such a structure that a dielectric is interposed between a first electrode 10 and a second electrode 20 each formed by utilizing a wiring. As shown in each of FIGS. 1A to 1C, the unit capacitative element is composed of the first electrode 10, and the second electrode 20. In this case, the second electrode 20 is provided to face the first electrode 10 through the dielectric, and surrounds the first electrode 10 on all four sides along a surface of the semiconductor substrate. Here, although the dielectric is not illustrated, the dielectric is provided between the first electrode 10 and the second electrode 20.

The capacitative element of the present invention adopts such a structure that the first electrode 10 is surrounded on all four sides by the second electrode 20 in the wiring layer formed on the semiconductor substrate. Only with the structure of the unit capacitative element, the first electrode 10 is shielded by the second electrode 20, and thus external capacitive coupling is hardly added to the first electrode 10. Also, the first electrode 10 may have any shape as long as the first electrode 10 is surrounded on all four sides by the second electrodes 20.

Figure 2A:
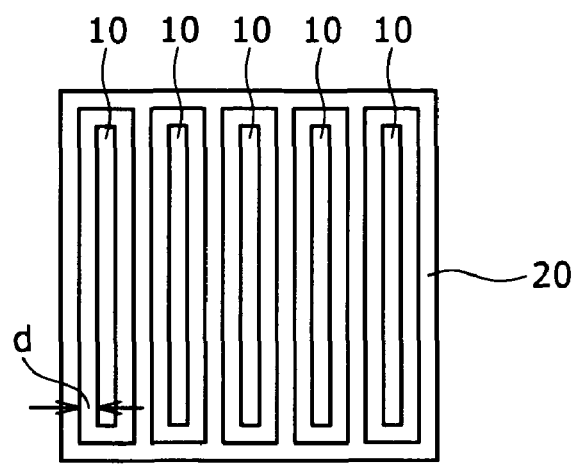
FIGS. 2A to 2C are respectively top plan views showing structures of capacitative element layers obtained by combining the unit capacitative elements shown in FIGS. 1A to 1C with one another.
Figure 2B:
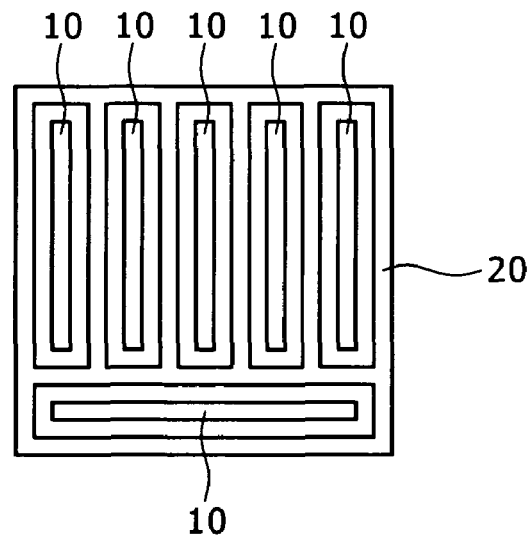
Figure 2C:
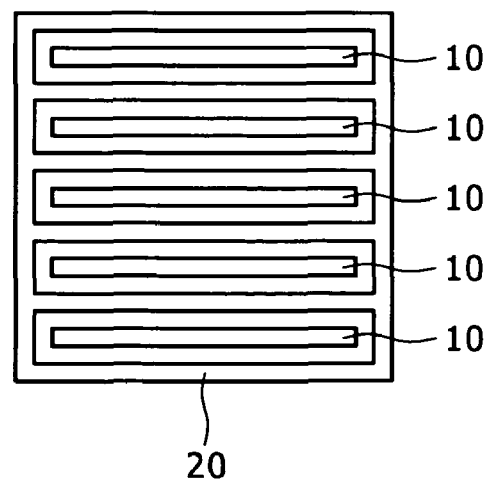

FIGS. 2A to 2C are respectively top plan views showing structures of capacitative element layers of first to third examples obtained by combining the unit capacitative elements shown in FIGS. 1A to 1C with one another in different ways, respectively.

The unit capacitative element layer of the first example shown in FIG. 2A has such a structure that a plurality of unit capacitative elements each shown in FIG. 1A are connected to one another along the surface of the semiconductor substrate. In this case, each adjacent two portions of the second electrode 20 of each adjacent two unit capacitative elements are shared with each other. In the case of the unit capacitative element layer of the first example shown in FIG. 2A, the five unit capacitative elements are transversely connected to one another. Also, the first electrode 10 of each of the unit capacitative elements is surrounded on all four sides by a corresponding portion of the second electrode 20 composing corresponding one of the unit capacitative elements together with the first electrode 10. In addition, in terms of the entire unit capacitative element layer structured by connecting the five unit capacitative elements each shown in FIG. 1A with one another, the five first electrodes 10 and the four portions of the second electrode 20 which are located inside the entire unit capacitative element layer are surrounded on all four sides by an outermost portion of the second electrode 20.

The unit capacitative element layer of the second example shown in FIG. 2B has such a structure that a plurality of unit capacitative elements each shown in FIG. 1A are connected to one another along the surface of the semiconductor substrate, and also the unit capacitative element shown in FIG. 1B is connected to the plurality of unit capacitative elements each shown in FIG. 1A in a direction perpendicularly intersecting with the direction of disposition of the plurality of unit capacitative elements each shown in FIG. 1A. Specifically, in the unit capacitative element layer of the second example shown in FIG. 2B, the six unit capacitative elements are connected to one another. In this case, of the six unit capacitative elements, the five unit capacitative elements are connected to one another in the same direction as that of a first level shown in FIG. 2A, but the one unit capacitative element is connected to the five unit capacitative elements in one end thereof in the direction perpendicularly intersecting with the direction of disposition of the five unit capacitative elements. The first electrode 10 of the one unit capacitative element connected in the direction perpendicularly intersecting with the direction of disposition of the five unit capacitative elements is utilized for structuring a two-terminal capacitative element. This will be descried later.

In the case as well of the unit capacitative element layer shown in FIG. 2B, the first electrode 10 of each of the unit capacitative elements is surrounded on all four sides by the corresponding portion of the second electrode 20 composing the corresponding one of the unit capacitative elements together with the first electrode 10. In addition, in terms of the entire circuit capacitative element layer structured by connecting the six unit capacitative elements with one another, the six first electrodes 10 and the five portions of the second electrode 20 which are located inside the entire unit capacitative element layer are surrounded on all four sides by the outermost portion of the second electrode 20.

The unit capacitative element layer shown in FIG. 2C has the same structure as that of the unit capacitative element layer in the first level shown in FIG. 2A. In this case, however, the direction of disposition of the first electrodes 10 of the five unit capacitative elements shown in FIG. 2C perpendicularly intersects with the direction of disposition of the first electrodes 10 of the five unit capacitative elements shown in FIG. 2A.

In each of the unit capacitative elements shown in FIGS. 2A to 2C, a high capacitance is obtained as a wiring width "d" as an interval between the first electrode 10 and the corresponding portion of the second electrode 20 is narrower. Also, a high capacitance is obtained as a circumferential length of each of the first electrodes 10 is longer. This structure provides the same effect as that in the existing art with which the slender wirings are arranged in parallel with one another in the capacitative element utilizing the wirings. Thus, it is possible to increase the capacitance per unit area. Of course, the first electrode 10 surrounded by the corresponding portion of the second electrode 20 is shielded by the corresponding portion of the second electrode 20.

Note that, the three structures of the unit capacitative element layers are exemplified here. However, a structure that a plurality of unit capacitative elements are connected in a matrix with one another along the surface of the semiconductor substrate may be adopted, or any other suitable combination may also be adopted as the structure. In addition, the capacitative element layer may be structured in the form of only the single layer with each of the layers as the unit capacitative element layer, or the capacitative element layer may be structured by laminating a plurality of unit capacitative element layers in a direction vertical to the surface of the semiconductor substrate.

A multi-layer structure that a plurality of unit capacitative element layers shown in FIGS. 2A to 2C are laminated in the direction vertical to the surface of the semiconductor substrate is used, thereby structuring a capacitative element in which each of the first electrodes is shielded by the corresponding portion of the second electrode.

When the multi-layer structure is used, portions in which the first electrodes of the first and second levels overlap each other, and portions in which the second electrodes of the first and second levels overlap each other are connected to each other by via holes, respectively. As a result, the capacitative element is obtained in which the second level wiring and the first level wiring are short-circuited, and each of the first electrodes 10 is covered with the corresponding portion of the second electrode 20.

In this connection, when the unit capacitative element layer shown in FIG. 2B is used as the unit capacitative element layer of the second level, common one terminals are drawn from the unit capacitative elements disposed so as to perpendicularly intersect with each other, respectively, thereby making it possible to readily structure a two-terminal capacitative element.

Figure 3:
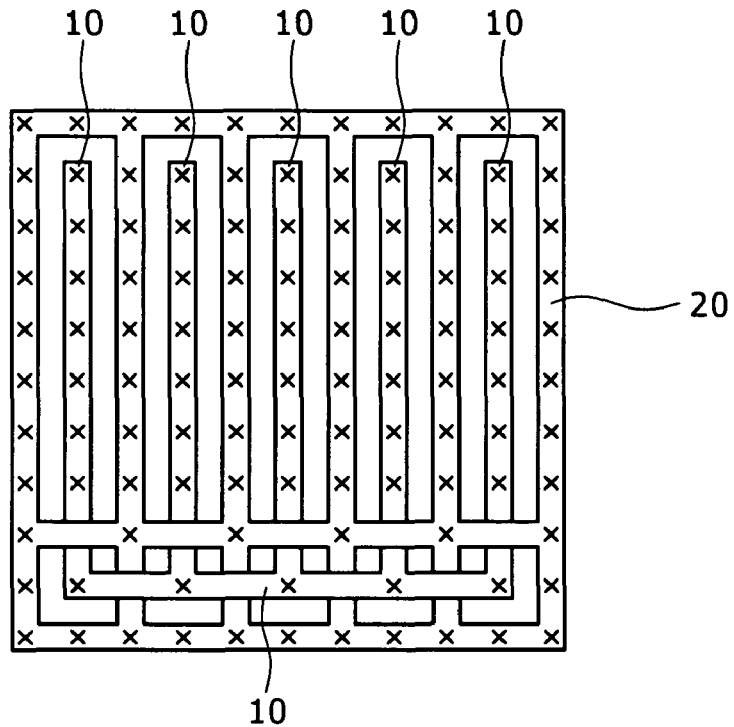
FIG. 3 is a top plan view showing a capacitative element structured by stacking the unit capacitative element layer as a second level shown in FIG. 2B on top of the unit capacitative element layer as a first level shown in FIG. 2A.

FIG. 3 is a top plan view showing a state in which the unit capacitative element layer shown in FIG. 2B as the second level is stacked on top of the unit capacitative element layer shown in FIG. 2A as the first level. As shown in FIG. 3, an assembly of the unit capacitative elements, and a plurality of unit capacitative element layers are short-circuited by via holes (each indicated in FIG. 3 by a mark x), thereby making it possible to make a two-terminal capacitative element in which each of the first electrodes 10 is shielded by the corresponding portion of the second electrode 20.

In addition, this capacitative element layer of the present embodiment adopts such a structure that the first electrode 10 and the second electrode 20 are necessarily, alternately disposed within the same level, and thus the same electrodes are not disposed adjacent to each other. Therefore, the capacitance per unit area can be increased as compared with the case of the structure of the existing capacitative element in which the same electrodes are disposed adjacent to each other in the peripheral portion.

Here, an effect of the shielding function will be described. For the purpose of realizing an analog-to-digital converter, a digital-to-analog converter, a filter circuit, and the like in an analog circuit obtained in a CMOS (Complementary Metal Oxide Semiconductor) process, a sample-and-hold circuit is utilized in some cases. Then, a description will now be given with respect to an effect when the capacitative element of the present invention is applied to a simple sample-and-hold circuit.

Figure 4:
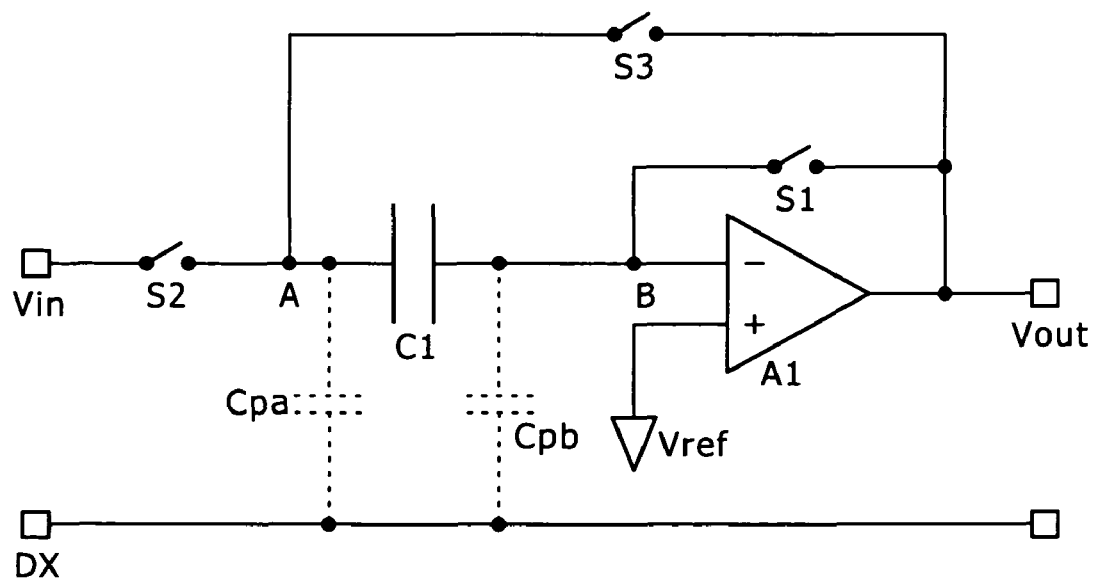
FIG. 4 is a circuit diagram showing a configuration of a sample-and-hold circuit.

FIG. 4 is a circuit diagram showing a configuration of a sample-and-hold circuit. The sample-and-hold circuit is controlled by three switches S1, S2 and S3. One terminal (inverting input terminal) of the switch S1 is connected to each of one terminal of an operational amplifier A1 and one terminal of a capacitative element C1, and the other terminal of the switch S1 is connected to each of an output terminal of the operational amplifier A1 and the other terminal of the switch S3.

One terminal of the switch S2 is connected to Vin, and the other terminal of the switch S2 is connected to each of the other terminal of the capacitative element C1 and one terminal of the switch S3. A plus (+) terminal (non-inverting input terminal) of the operational amplifier A1 is connected to a reference voltage Vref.

Next, two operation states of the sample-and-hold circuit shown in FIG. 4 will be described. An operation state in which each of the switches S1 and S2 is in an ON state, and the switch S3 is in an OFF state is a sampling mode. In the sampling mode, the operational amplifier A1 operates in a buffer state so that a relationship of Vout=Vb≈Vref where Vb is a voltage at a node B, and Vin=Va is established. At this time, the capacitative element C1 is charged with the electric charges of {(capacitance of capacitative element C1)×(Vin−Vref)}.

A state in which each of the switches S1 and S2 is in the OFF state, and the switch S3 is in the ON state is a hold mode. In the hold mode, a relationship of Vb Vref is established because the node B is virtually grounded in a state in which negative feedback is made for the operational amplifier A1 through the capacitative element C1.

When the electric charges generated from the switches S1, S2 and S3 are disregarded, a relationship of Va=Vout=Vin is established because the electric charges accumulated in the capacitative element C1 are reserved. When a signal line DX is wired in the vicinity of the sample-and-hold circuit shown in FIG. 3, a parasitic capacitance Cpa occurs between the node A and the signal wiring DX. In addition, a parasitic capacitance Cpb occurs between the node B and the signal line DX.

Figure 5:
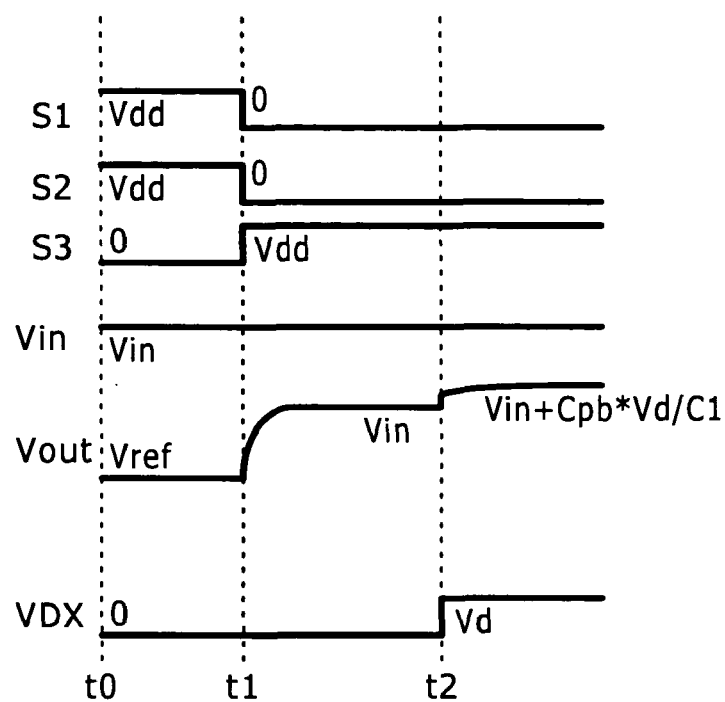
FIG. 5 is timing charts explaining an operation of the sample-and-hold circuit shown in FIG. 4.

When the signals Vin, VDX, etc. are inputted in the manner as shown in timing charts of FIG. 5, the sample-and-hold circuit shown in FIG. 4 becomes the sampling mode for a time period from t0 to t1, and becomes the hold state at and after t1. Also, for a time period from t1 to t2, a relationship of Vout=Vin is established.

A description will be given with respect to a circuit operation in the case where the voltage VDX of the wiring DX changes from 0 V to Vd at a timing of t2 when the sample-and-hold circuit shown in FIG. 4 is in the hold state. When the voltage VDX of the wiring DX changes from 0 to Vd, the electric charges of (Cpa×Vd) are transmitted to the node A through the parasitic capacitance Cpa. The electric charges of (Cpa×Vd) are supplied through the output terminal of the operational amplifier A1 because the short-circuit is caused between the node A and the output terminal of the operational amplifier A1. For this reason, even when the parasitic capacitance Cpa is parasitic on the node A, the output value Vout of the sample-and-hold circuit is held at Vin.

In addition, when the voltage VDX of the wiring DX changes from 0 V to Vd, the electric charges of (Cpd×Vd) are transmitted to the node B through the parasitic capacitance Cpb. At this time, the electric charges of (Cpd×Vd) are held as they are because the electric charges are nowhere supplied to the node B. As a result, the electric charges in the capacitance element C1 becomes {(capacitance of C1)×(Vin−Vref)+Cpb×Vd}, and thus the output voltage Vout becomes (Vin+Cpb×Vd/C1). This represents that in the case where the voltage VDX of the signal DX changes when the sample-and-hold circuit shown in FIG. 4 is in the hold state, an error of (Cpb×Vd/C1) occurs.

Since the parasitic capacitance Cpb hardly occurs when the present invention is applied to the capacitive element C1, a relationship of Vout≈Vin is established, and thus the voltage from the original circuit characteristics is outputted. When the existing capacitive element is used, some sort of measures needs to be taken in order to reduce that error. For this reason, taking measures to cope with the error voltage leads to an increase in chip area. The capacitive element of the present embodiment is used in the circuit utilizing the sample and hold in the manner as described above, which results in that it is possible to obtain effects of an improvement in the characteristics of the analog circuit, and reduction in chip area.

First Embodiment

Figure 6:
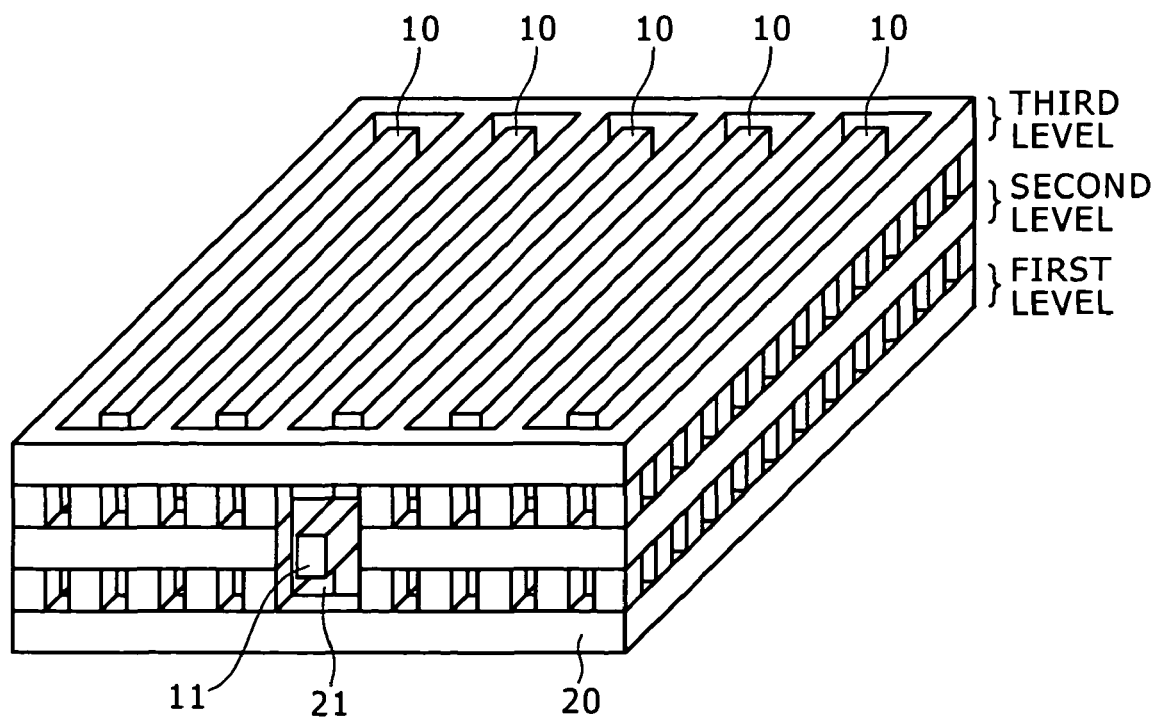
FIG. 6 is a perspective view showing a structure of a capacitative element according to a first embodiment of the present invention.
Figure 7A:
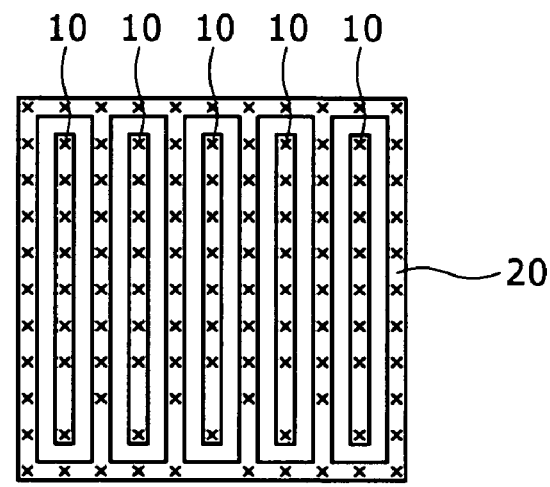
FIGS. 7A to 7C are respectively top plan views showing structures of a capacitative element layer of a first level, a capacitative element layer of a second level and a capacitative element layer of a third level of the capacitative element of the first embodiment.
Figure 7B:
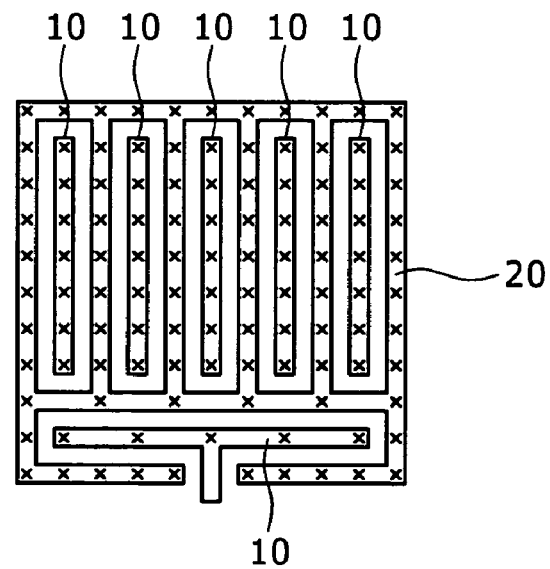
Figure 7C:
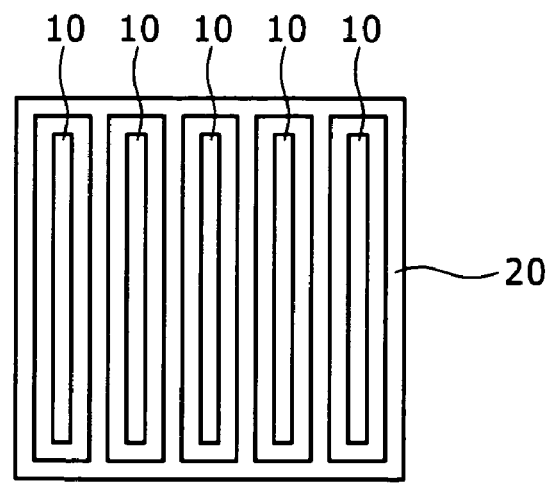

FIG. 6 is a perspective view showing a structure of a capacitative element according to a first embodiment of the present invention, and FIGS. 7A to 7C are respectively top plan views of first to third levels of the capacitative element of the first embodiment. Specifically, FIG. 7A shows a structure of the first level of the capacitative element of the first embodiment, FIG. 7B shows a structure of the second level of the capacitative element of the first embodiment, and FIG. 7C shows a structure of the third level of the capacitative element of the first embodiment. As shown in FIGS. 7A to 7C, each of the first electrodes 10 in the first level has a slender rod-like shape, and the second electrode 20 is formed so as to surround the first electrodes 10. This structure provides the unit capacitative element layer in which a plurality of unit capacitative elements each shown in any of FIGS. 1A to 1C are connected to one another along a surface of a semiconductor substrate (not shown).

In the structure of the first level shown in FIG. 7A, the five unit capacitative elements are transversely connected to one another, and each adjacent two portions of the second electrode 20 of each adjacent two unit capacitative elements are shared with each other. As a result, each of the first electrodes 10 of the respective unit capacitative elements is surrounded on all four sides by corresponding portion of the second electrode 20. Thus, there is obtained a structure that the capacitive coupling with the external wiring is hardly added to each of the first electrodes 10.

The unit capacitative element layer having such a structure that the first electrode 10 of the unit capacitative element perpendicularly intersecting with each of the five first electrodes 10 of the respective unit capacitative elements is provided in the end portion of the unit capacitative element layer similar to that in the first level is provided in the second level. The structure in the second level shown in FIG. 7B has the six unit capacitative elements of the five unit capacitative elements having the respective first electrodes 10 provided in the same direction as that in the first level, and the one unit capacitative element having the first electrode 10 provided in a direction perpendicularly intersecting a direction of disposition of the five first electrodes of the five unit capacitative elements. In addition, via holes are respectively provided in portions (each indicated in FIGS. 7A and 7B by a mark x) in which when viewed from the direction vertical to the surface of the substrate, the first electrodes 10 of the first and second levels overlap each other, and the second electrodes 20 of the first and second levels overlap each other. As a result, the first electrodes of the first and second levels, and the second electrodes of the first and second levels become each a conduction state.

The third level shown in FIG. 7C has the same structure as that of the first level shown in FIG. 7A. That is to say, the unit capacitative element layer in which a plurality of unit capacitative elements having the respective first electrodes 10 surrounded by the corresponding portions of the second electrode 20 are transversely connected to one another is provided in the third level. As a result, each of the first electrodes 10 of the respective unit capacitative elements is surrounded on all four sides by corresponding portion of the second electrode 20.

In the structure in the third level shown in FIG. 7C, the five unit capacitative elements are transversely connected to one another, and each adjacent two portions of the second electrode 20 of each adjacent two unit capacitative elements are shared with each other. As a result, each of the first electrodes 10 of the respective unit capacitative elements is surrounded on all four sides by a corresponding portion of the second electrode 20. Thus, there is obtained a structure that the capacitive coupling with the external wiring is hardly added to each of the first electrodes 10.

The via holes are respectively provided in portions in which when viewed from the direction vertical to the surface of the substrate, the first electrodes 10 of the second and third levels overlap each other, and the second electrodes 20 of the second and third levels overlap each other. As a result, the first electrodes of the second and third levels, and the second electrodes of the second and third levels become each a conduction state.

In the first embodiment, the capacitor is composed of the first electrodes 10 and the second electrode 20 within the same level. Also, the via holes through which the first electrodes of each adjacent two levels, and the second electrodes of each adjacent two levels are connected to each other, respectively, are provided, whereby a capacitor is also structured between each of the via holes of the first electrodes 10, and each of the via holes of the second electrodes 20. As a result, it is possible to increase the capacitance per unit area.

It should be noted that although the first embodiment adopts the structure that each of the first electrodes is surrounded on all four sides by the corresponding portion of the second electrode, it may be impossible to obtain the conduction between each of the first electrodes, and the outside as long as that structure is adopted. In order to cope with this problem, a slot 21 is provided in a part of the second electrode 20 as the outermost circumference of the second level for the purpose of connecting each of the first electrodes 10 surrounded on all four sides by the corresponding portion of the second electrode 20 to the outside. Also, a connection terminal 11 to the corresponding one of the first electrodes 10 is provided through the slot 21. As a result, there is structured the capacitative element which has two terminals of the connection terminal 11 and the outermost portion of the second electrode 20 surrounding the outer circumference, and which is shielded by the second electrode 20.

Second Embodiment

Figure 8:
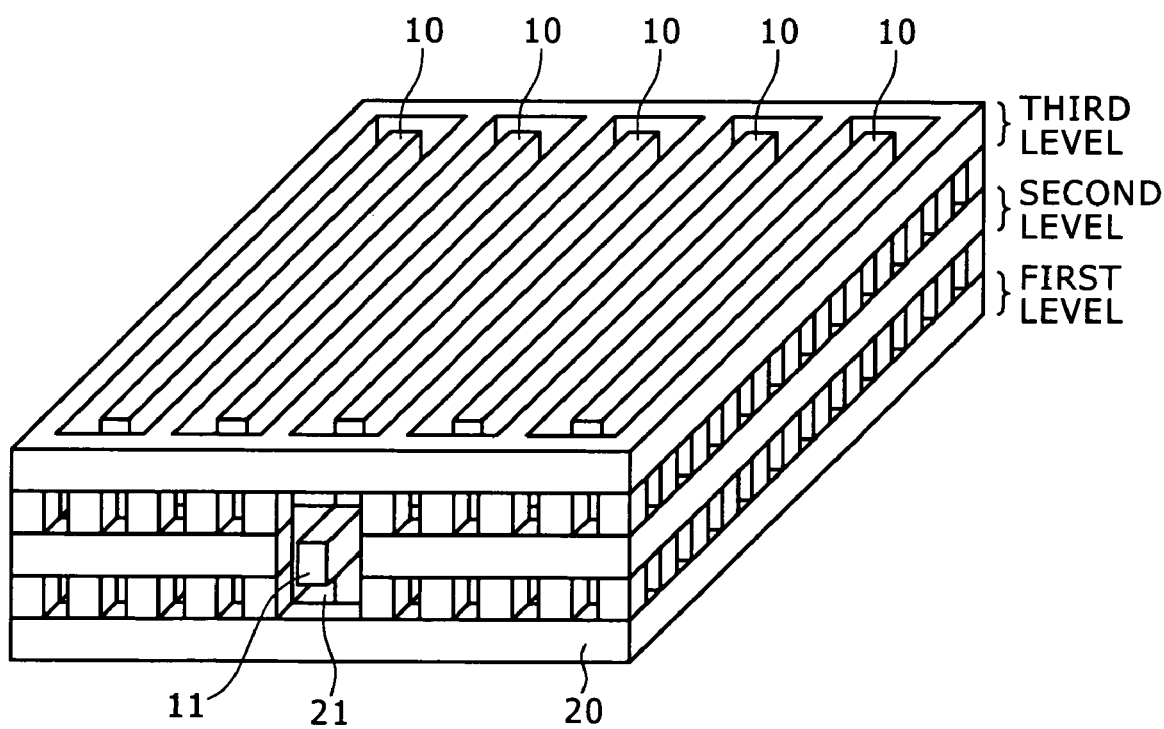
FIG. 8 is a perspective view showing a structure of a capacitative element according to a second embodiment of the present invention.
Figure 9A:
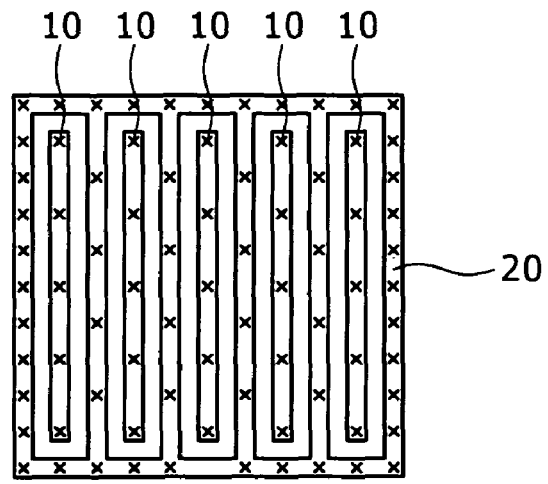
FIGS. 9A to 9C are respectively top plan views showing structures of a capacitative element layer of a first level, a capacitative element layer of a second level and a capacitative element layer of a third level of the capacitative element of the second embodiment.
Figure 9B:
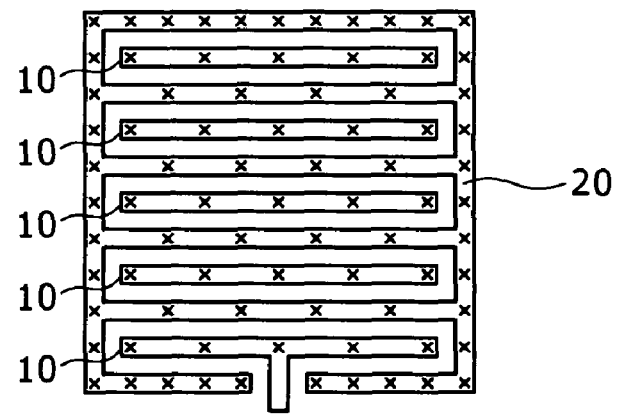
Figure 9C:
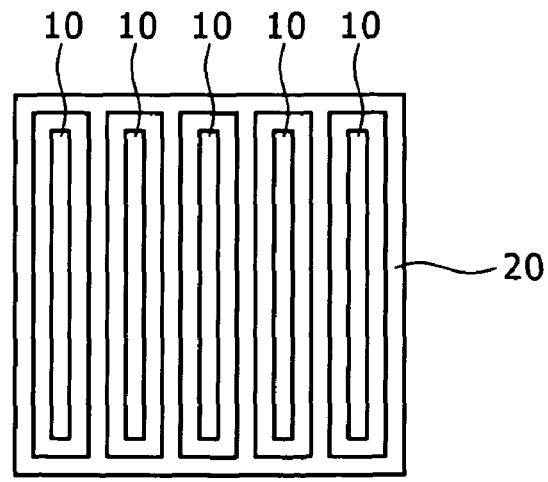

FIG. 8 is a perspective view showing a structure of a capacitative element according to a second embodiment of the present invention, and FIGS. 9A to 9C are respectively top plan views of first to third levels of the capacitative element of the second embodiment. Specifically, FIG. 9A shows a structure of the first level of the capacitative element of the second embodiment, FIG. 9B shows a structure of the second level of the capacitative element of the second embodiment, and FIG. 9C shows a structure of the third level of the capacitative element of the second embodiment. As shown in FIGS. 9A to 9C, each of the first electrodes 10 in the first level has a slender rod-like shape, and the second electrode 20 is formed so as to surround the first electrodes 10. This structure provides the unit capacitative element layer in which a plurality of unit capacitative elements each shown in any of FIGS. 1A to 1C are connected to one another along the surface of the semiconductor substrate (not shown).

In the structure of the first level shown in FIG. 9A, the five unit capacitative elements are transversely connected to one another, and each adjacent two portions of the second electrode 20 of each adjacent two capacitative elements are shared with each other. As a result, each of the first electrodes 10 of the respective unit capacitative elements is surrounded on all four sides by a corresponding portion of the second electrode 20. Thus, there is obtained a structure that the capacitive coupling with the external wiring is hardly added to each of the first electrodes 10.

The unit capacitative element layer of the second level shown in FIG. 9B has the same structure as that of the unit capacitative element layer of the first level shown in FIG. 9A. However, each of the first electrodes 10 of the unit capacitative element layer of the second level is disposed in the direction perpendicularly intersecting with the direction of disposition of the first electrodes 10 of the unit capacitative element layer of the first level. In the structure of the second level shown in FIG. 9B, each adjacent two portions of the second electrode 20 of each two unit capacitative elements are shared with each other. As a result, each of the first electrodes 10 is surrounded on all four sides by corresponding portion of the second electrode 20. Thus, there is obtained the structure that the capacitive coupling with the external wiring is hardly added to each of the first electrodes 10.

The structure of the third level shown in FIG. 9C has the same shape as that of the structure of the first level. As a result, the first electrodes 10 each surrounded on all four sides by the corresponding portions of the second electrode 20 in the third level are arranged in the direction perpendicularly intersecting with the first electrodes 10 in the second level. In the structure of the third level shown in FIG. 9C, the five unit capacitative elements are transversely connected to one another, and each adjacent two portions of the second electrode 20 of each adjacent two unit capacitative elements are shared with each other. As a result, each of the first electrodes 10 of the respective unit capacitative elements is surrounded on all four sides by a corresponding portion of the second electrode 20. Thus, there is obtained a structure that the capacitive coupling with the external wiring is hardly added to each of the first electrodes 10.

For the first to third levels, via holes are respectively provided in portions (each indicated in FIGS. 9A and 9B by a mark x) in which when viewed from the direction vertical to the surface of the substrate, the first electrodes 10 of the first and second levels overlap each other, and the second electrodes 20 of the first and second levels overlap each other. Also, the via holes are respectively provided in portions in which when viewed from the direction vertical to the surface of the substrate, the first electrodes 10 of the second and third levels overlap each other, and the second electrodes 20 of the second and third levels overlap each other. In the second embodiment, the capacitor is composed of the first electrodes 10 and the second electrode 20 within the same level. Also, the via holes through which the first electrodes of each adjacent two levels, and the second electrodes of each adjacent two levels are connected to each other, respectively, are provided, whereby a capacitor is also structured between each of the via holes of the first electrodes 10, and each of the via holes of the second electrodes 20. As a result, it is possible to increase the capacitance per unit area.

It should be noted that although the second embodiment adopts the structure that each of the first electrodes 10 is surrounded on all four sides by the corresponding portion of the second electrode 20, it may be impossible to obtain the conduction between each of the first electrodes, and the outside as long as that structure is adopted. In order to cope with this problem, the slot 21 is provided in a part of the second electrode 20 as the outermost circumference of the second level for the purpose of connecting each of the first electrodes 10 surrounded on all four sides by the corresponding portion of the second electrode 20 to the outside. Also, a connection terminal 11 to the corresponding one of the first electrodes 10 is provided through the slot 21.

In the capacitative element of the second embodiment, the direction of disposition of the first electrodes 10 in the second level is made to perpendicularly intersect with the direction of disposition of the first electrodes 10 in the first and third levels. Also, the first electrodes 10 of the first and second levels, and the second electrodes of the first and second levels become each the conduction state through the via holes in the first electrodes and the via holes in the second electrodes. Since the first electrodes 10 and the portion of the second electrode 20 are entirely disposed in a matrix, there is obtained the structure with which the parasitic capacitance can be reduced as compared with the case of the capacitative element of the first embodiment.

Third Embodiment

Figure 10:
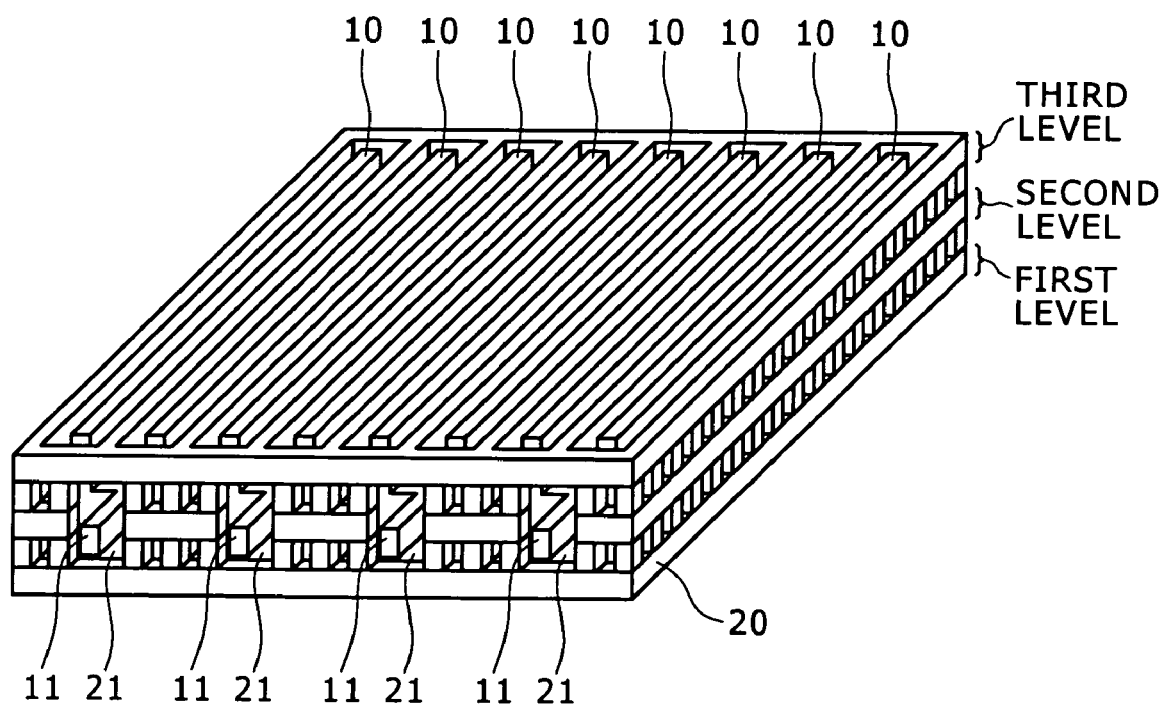
FIG. 10 is a perspective view showing a structure of a capacitative element according to a third embodiment of the present invention.
Figure 11A:
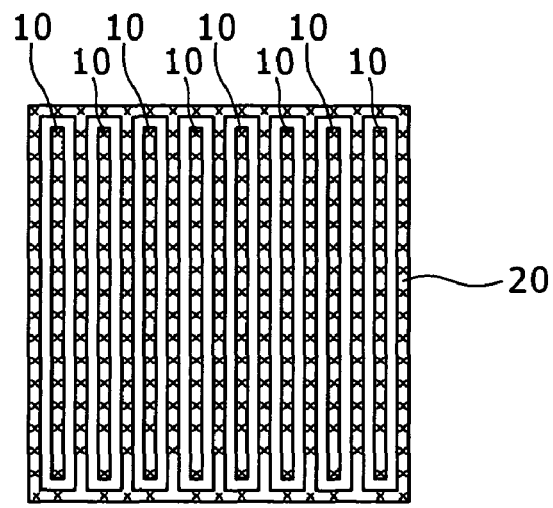
FIGS. 11A to 11C are respectively top plan views showing structures of a capacitative element layer of a first level, a capacitative element layer of a second level and a capacitative element layer of a third level of the capacitative element of the third embodiment.
Figure 11B:
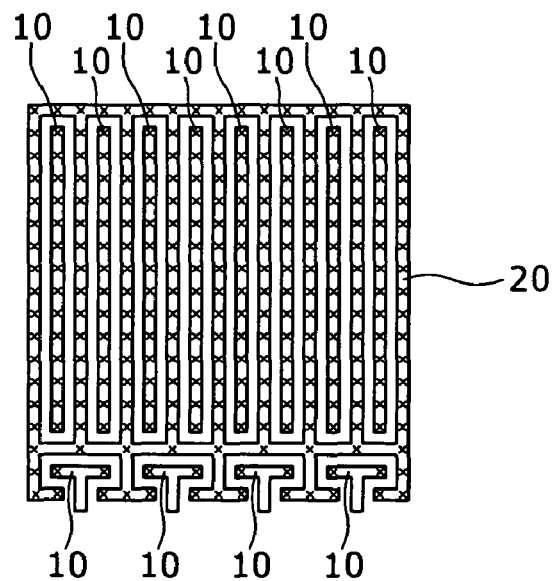
Figure 11C:
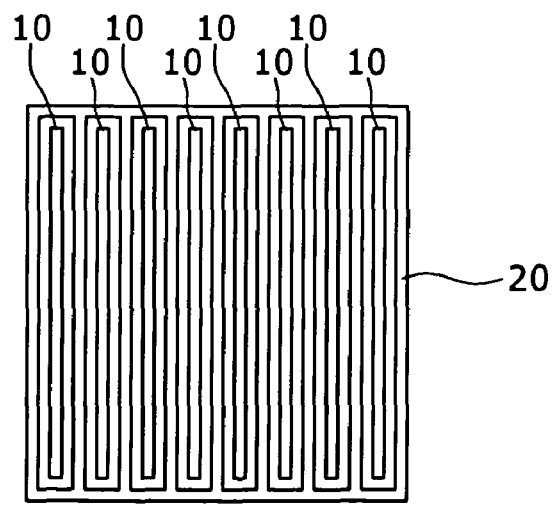

FIG. 10 is a perspective view showing a structure of a capacitative element according to a third embodiment, and FIGS. 11A to 11C are respectively top plan views of first to third levels of the capacitative element of the third embodiment. Specifically, FIG. 11A shows a structure of the first level of the capacitative element of the third embodiment, FIG. 11B shows a structure of the second level of the capacitative element of the third embodiment, and FIG. 11C shows a structure of the third level of the capacitative element of the third embodiment. As shown in FIGS. 11A to 11C, each of the first electrodes 10 in the first level has a slender rod-like shape, and the second electrode 20 are formed so as to surround the first electrodes 10. This structure provides the unit capacitative element layer in which a plurality of unit capacitative elements each shown in any of FIGS. 1A to 1C are connected to one another along the surface of the semiconductor substrate (not shown).

In the structure of the first level shown in FIG. 11A, the eight unit capacitative elements are transversely connected to one another, and each adjacent two portions of the second electrode 20 of each adjacent two unit capacitative elements are shared with each other. As a result, each of the first electrodes 10 of the respective unit capacitative elements is surrounded on all four sides by a corresponding portion of the second electrode 20. Thus, there is obtained a structure that the capacitive coupling with the external wiring is hardly added to each of the first electrodes 10.

The unit capacitative element layer having such a structure that a plurality of unit capacitative elements each having the first electrode 10 perpendicularly intersecting with each of the first electrodes 10 of the unit capacitative elements in the first level are provided in the end portion of the unit capacitative element layer similar to that in the first level is provided in the second level. In the structure of the second level shown in FIG. 11B, the unit capacitative elements having the respective first electrodes 10 perpendicularly intersecting with the first electrodes 10 disposed in the same direction as that in the first level are disposed in one out of every two first electrodes 10 disposed in the same direction as that in the first level.

The third level shown in FIG. 11C has the same structure as that of the first level shown in FIG. 11A. That is to say, the unit capacitative element layer in which a plurality of unit capacitative elements having the respective first electrodes 10 each surrounded on all four sides by the second electrode 20 are transversely connected to one another is provided in the third level. In the structure of the third level shown in FIG. 1C, the eight unit capacitative elements are transversely connected to one another, and each adjacent two portions of the second electrode 20 of each adjacent two unit capacitative elements are shared with each other. As a result, each of the first electrodes 10 of the respective unit capacitative elements is surrounded on all four sides by the corresponding portion of the second electrode 20.

For the first to third levels, via holes are respectively provided in portions (each indicated in FIGS. 11A and 11B by a mark x) in which when viewed from the direction vertical to the surface of the substrate, the first electrodes 10 of each adjacent two levels overlap each other, and portions of the second electrode 20 of each adjacent two levels overlap each other. In the third embodiment, the capacitor is composed of the first electrodes 10 and the second electrode 20 within the same level. Also, the via holes through which the first electrodes of each adjacent two levels, and portions of the second electrode of each adjacent two levels are connected to each other, respectively, are provided, whereby a capacitor is also structured between each of the via holes of the first electrodes 10, and each of the via holes of the second electrode 20. As a result, it is possible to increase the capacitance per unit area.

In addition, in the second level shown in FIG. 11B, for the external connection to the first electrodes 10, of the respective unit capacitative elements, provided in the end portion of the unit capacitative element layer in the second level, the slots 21 are provided so as to correspond to the unit capacitative elements, respectively. Also, the connection terminals 11 to the first electrodes 10 are provided through the slots 21, respectively. Since in the third embodiment, the four unit capacitative elements are provided in the end portion of the capacitative element layer in the second level, the four slots 21 and the four connection terminals 11 are provided each so as to correspond to the four unit capacitative elements provided in the end portion thereof, respectively. As a result, it is possible to structure the multi-terminal capacitative element having the four connection terminals 11, and the outermost portion of the second electrode 20 surrounding the outer circumference. In the third embodiment, it is possible to structure the capacitative element in which the first electrodes 10 are shielded by the second electrode 20 in spite of the multi-terminal type.

Fourth Embodiment

Figure 12:
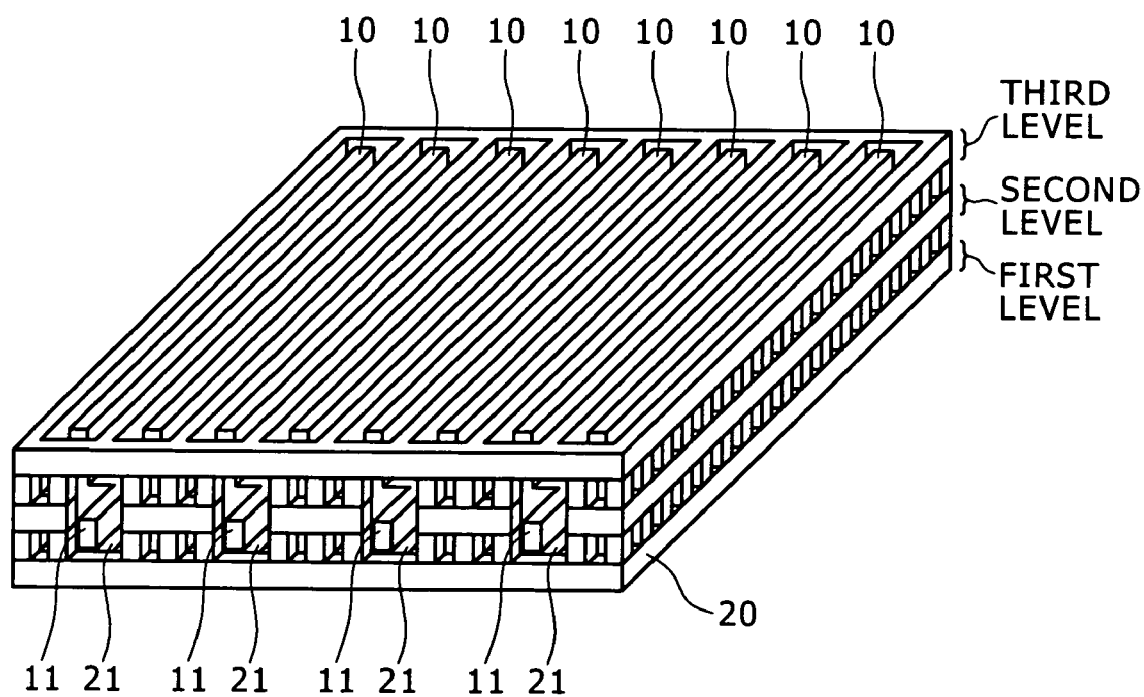
FIG. 12 is a perspective view showing a structure of a capacitative element according to a fourth embodiment of the present invention.
Figure 13A:
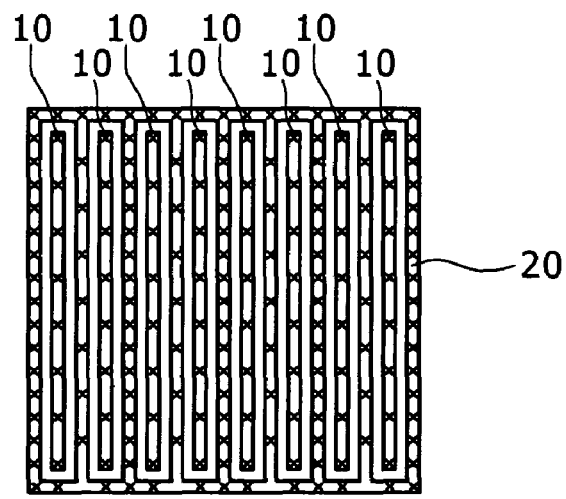
FIGS. 13A to 13C are respectively top plan views showing structures of a capacitative element layer of a first level, a capacitative element layer of a second level and a capacitative element layer of a third level of the capacitative element of the fourth embodiment.
Figure 13B:
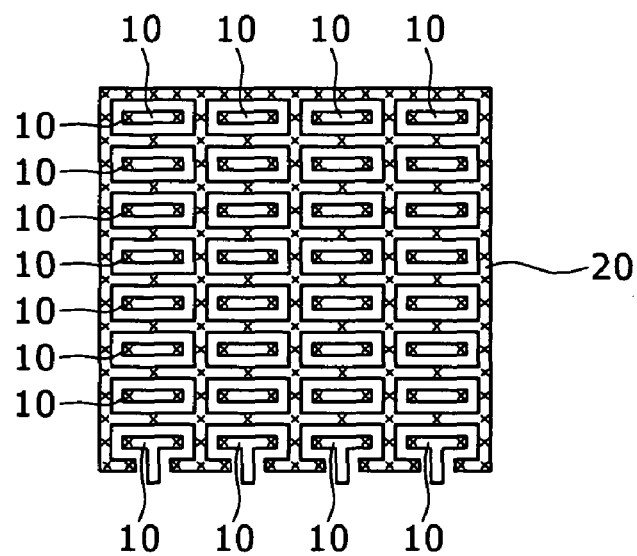
Figure 13C:
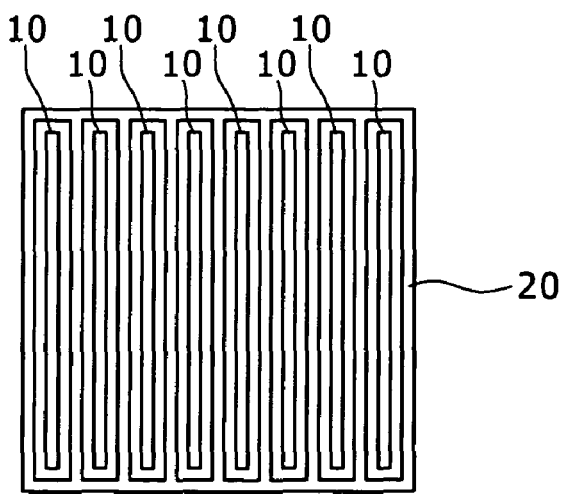

FIG. 12 is a perspective view showing a structure of a capacitative element according to a fourth embodiment, and FIGS. 13A to 13C are respectively top plan views of first to third levels of the capacitative element of the fourth embodiment. Specifically, FIG. 13A shows a structure of the first level of the capacitative element of the fourth embodiment, FIG. 13B shows a structure of the second level of the capacitative element of the fourth embodiment, and FIG. 13C shows a structure of the third level of the capacitative element of the fourth embodiment. As shown in FIGS. 13A to 13C, each of the first electrodes 10 in the first level has a slender rod-like shape, and the second electrode 20 is formed so as to surround the first electrodes 10. This structure provides the unit capacitative element layer in which a plurality of unit capacitative elements each shown in any of FIGS. 1A to 1C are connected to one another along the surface of the semiconductor substrate (not shown).

In the structure of the first level shown in FIG. 13A, the eight unit capacitative elements are transversely connected to one another, and each adjacent two portions of the second electrodes 20 of each adjacent two unit capacitative elements are shared with each other. As a result, each of the first electrodes 10 of the respective unit capacitative elements is surrounded on all four sides by a corresponding portion of the second electrode 20. Thus, there is obtained a structure that the capacitive coupling with the external wiring is hardly added to each of the first electrodes 10.

The second level shown in FIG. 13B is structured in the form of a unit capacitative element layer in which the first electrodes 10 are disposed in the direction perpendicularly intersecting with the direction of disposition of the first electrodes 10 in the first level, and a plurality of unit capacitative elements each composed of the first electrode 10 and the second electrode 20 surrounding the first electrode 10 on all four sides are connected to one another in a matrix. In the structure of the second level shown in FIG. 13B, the eight first electrodes 10 of the second level each making conduction with the two first electrodes 10 of the first level are provided along the direction of extension of the first electrodes 10 of the first level. That is to say, the four first electrodes 10 are disposed in the transverse direction in the figure, and the eight first electrodes 10 are disposed in the longitudinal direction in the figure. Also, the second electrode 20 is provided so as to surround the thirty-two first electrodes 10 in total.

The third level shown in FIG. 13C has the same structure as that of the first level shown in FIG. 13A. That is to say, the unit capacitative element layer in which a plurality of unit capacitative elements having the respective first electrodes 10 each surrounded on all four sides by the second electrode 20 are transversely connected to one another is provided in the third level. In the structure of the third level shown in FIG. 13C, the eight unit capacitative elements are transversely connected to one another, and each adjacent two portions of the second electrode 20 of each adjacent two unit capacitative elements are shared with each other. As a result, each of the first electrodes 10 of the respective unit capacitative elements is surrounded on all four sides by the corresponding portion of the second electrode 20.

For the first to third levels, via holes are respectively provided in portions (each indicated in FIGS. 13A and 13B by a mark x) in which when viewed from the direction vertical to the surface of the substrate, the first electrodes 10 of each adjacent two levels overlap each other, and portions of the second electrode 20 of each adjacent two levels overlap each other. In the fourth embodiment, the capacitor is composed of the first electrodes 10 and the second electrode 20 within the same level. Also, the via holes through which the first electrodes of each adjacent two levels, and portions of the second electrode of each adjacent two levels are connected to each other, respectively, are provided, whereby a capacitor is also structured between each of the via holes of the first electrodes 10, and each of the via holes of the second electrode 20. As a result, it is possible to increase the capacitance per unit area.

In addition, in the second level shown in FIG. 13B, for the external connection to the first electrodes 10, of the respective unit capacitative elements, provided in the end portion of the unit capacitative element layer in the second level, the slots 21 are provided so as to correspond to the unit capacitative elements, respectively. Also, the connection terminals 11 to the first electrodes 10 are provided through the slots 21, respectively. Since in the fourth embodiment, the four unit capacitative elements are provided in the end portion of the capacitative element layer in the second level, the four slots 21 and the four connection terminals 11 are provided each so as to correspond to the four unit capacitative elements provided in the end portion thereof, respectively. As a result, it is possible to structure the multi-terminal capacitative element having the four connection terminals 11, and the outermost portion of the second electrode 20 surrounding the outer circumference. In the fourth embodiment, it is possible to structure the capacitative element in which the first electrodes 10 are shielded by the second electrode 20 in spite of the multi-terminal type.

In the capacitative element of the fourth embodiment, the direction of disposition of the first electrodes 10 in the second level is made to perpendicularly intersect with the direction of disposition of the first electrodes 10 in the first and third levels, and thus the first electrodes 10 of the second level are disposed in a matrix, whereby it is possible to reduce a parasitic resistance as compared with the case of the capacitative element of the third embodiment.

Fifth Embodiment

Figure 14:
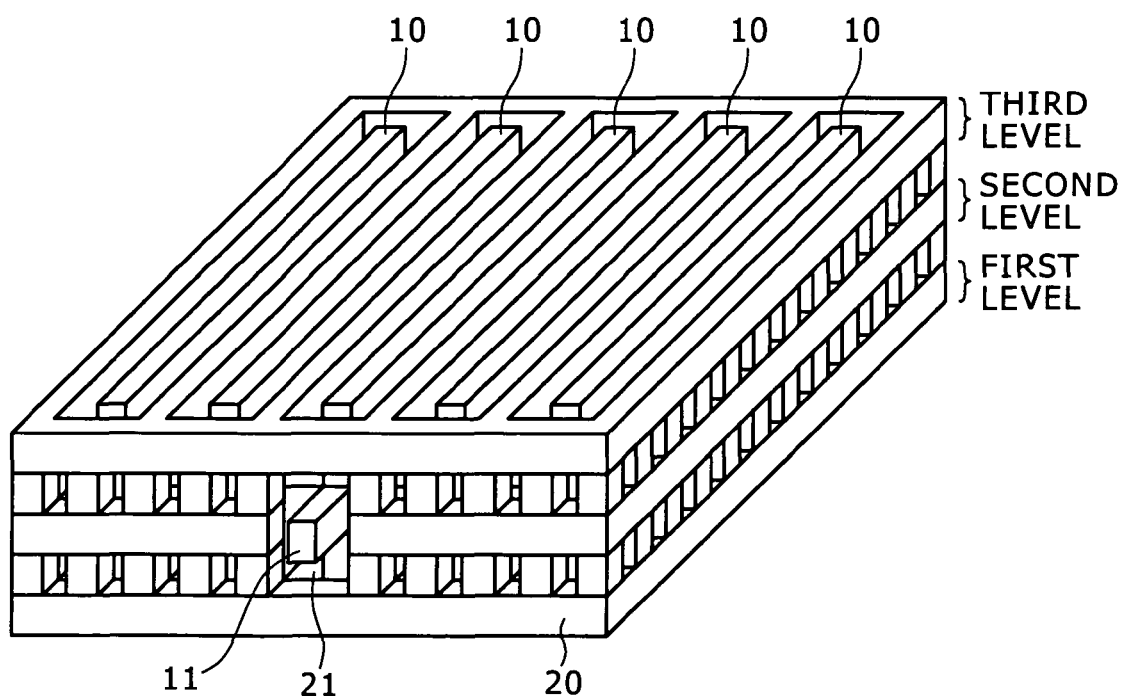
FIG. 14 is a perspective view showing a structure of a capacitative element according to a fifth embodiment of the present invention.
Figure 15A:
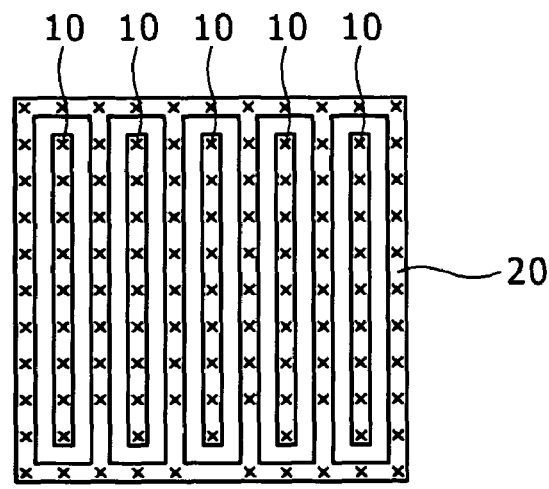
FIGS. 15A to 15C are respectively top plan views showing structures of a capacitative element layer of a first level, a capacitative element layer of a second level and a capacitative element layer of a third level of the capacitative element of the fifth embodiment.
Figure 15B:
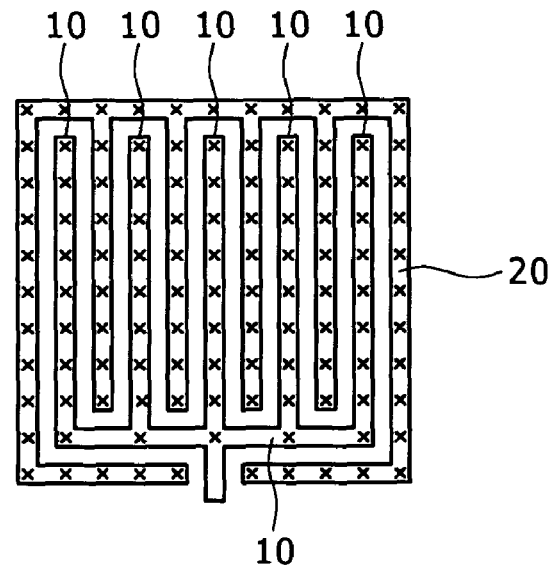
Figure 15C:
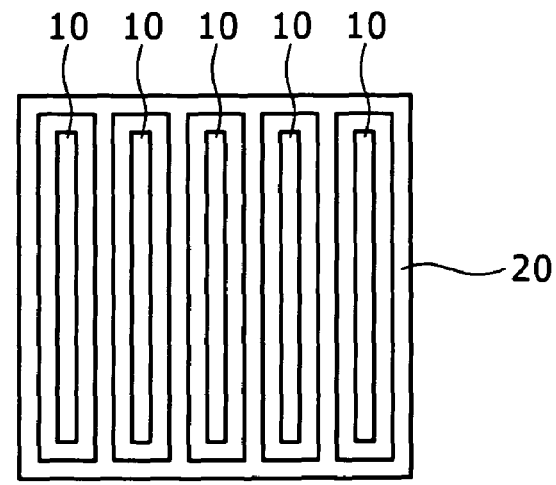

FIG. 14 is a perspective view showing a structure of a capacitative element according to a fifth embodiment, and FIGS. 15A to 15C are respectively top plan views of first to third levels of the capacitative element of the fifth embodiment. Specifically, FIG. 15A shows a structure of the first level of the capacitative element of the fifth embodiment, FIG. 15B shows a structure of the second level of the capacitative element of the fifth embodiment, and FIG. 15C shows a structure of the third level of the capacitative element of the third embodiment. As shown in FIGS. 15A to 15C, each of the first electrodes 10 in the first level has a slender rod-like shape, and the second electrode 20 is formed so as to surround the first electrodes 10. This structure provides the unit capacitative element layer in which a plurality of unit capacitative elements each shown in any of FIGS. 1A to 1C are connected to one another along the surface of the semiconductor substrate (not shown).

In the structure of the first level shown in FIG. 15A, the five unit capacitative elements are transversely connected to one another, and each adjacent two portions of the second electrode 20 of each adjacent two unit capacitative elements are shared with each other. As a result, each of the first electrodes 10 of the respective unit capacitative elements is surrounded on all four sides by a corresponding portion of the second electrode 20. Thus, there is obtained a structure that the capacitive coupling with the external wiring is hardly added to each of the first electrodes 10.

In the structure of the second level shown in FIG. 15B, the first electrode 10 and the second electrode 20 which are provided in the same direction as that of disposition of the first electrodes 10 and the second electrode 20 of the first level are formed in sinking comb-like shapes, respectively, as a whole, and the first electrodes 10 and the second electrode 20 are provided so as to be engaged with each other through a dielectric. Thus, the unit capacitative element layer is structured in which the second electrode 20 is provided so as to surround the first electrode 10 on all four sides in the outermost circumference.

In the structure of the second level shown in FIG. 15B, the five unit capacitative elements are transversely connected to one another, and one ends of the sinking comb-like portions of the first electrode 10 of the five unit capacitative elements are connected to one another to obtain the sinking comb-like shape. On the other hand, the sinking comb-like portions of the second electrode 20 are provided so as to be engaged with the sinking comb-like portions of the first electrode 10. Moreover, the outermost portion of the second electrode 20 surrounds the outermost circumference.

The third level shown in FIG. 15C has the same structure as that of the first level shown in FIG. 15A. That is to say, the unit capacitative element layer in which a plurality of unit capacitative elements having the respective first electrodes 10 each surrounded on all four sides by the second electrode 20 are transversely connected to one another is provided in the third level. As a result, each of the first electrodes 10 of the respective unit capacitative elements is surrounded on all four sides by the corresponding portion of the second electrode 20.

In the structure in the third level shown in FIG. 15C, the five unit capacitative elements are transversely connected to one another, and each adjacent two portions of the second electrode 20 of each adjacent two capacitative elements are shared with each other. As a result, each of the first electrodes 10 of the respective unit capacitative elements is surrounded on all four sides by a corresponding portion of the second electrode 20. Thus, there is obtained a structure that the capacitive coupling with the external wiring is hardly added to each of the first electrodes 10.

For the first to third levels, via holes are respectively provided in portions (each indicated in FIGS. 15A and 15B by a mark x) in which when viewed from the direction vertical to the surface of the substrate, the first electrodes 10 of each adjacent two levels overlap each other, and portions of the second electrode 20 of each adjacent two levels overlap each other. In the fifth embodiment, the capacitor is composed of the first electrodes 10 and the second electrode 20 within the same level. Also, the via holes through which the first electrodes of each adjacent two levels, and portions of the second electrode of each adjacent two levels are connected to each other, respectively, are provided, whereby a capacitor is also structured between each of the via holes of the first electrodes 10, and each of the via holes of the second electrode 20. As a result, it is possible to increase the capacitance per unit area.

In addition, the slot 21 is provided in a part of the second electrode 20 in the second level, and the connection terminal 11 to the first electrode 10 is provided through the slot 21. As a result, there is structured the capacitative element which has two terminals of the connection terminal 11 and the portion of the second electrode 20 surrounding the outermost circumference, and which is shielded by the second electrode 20.

Sixth Embodiment

Figure 16:
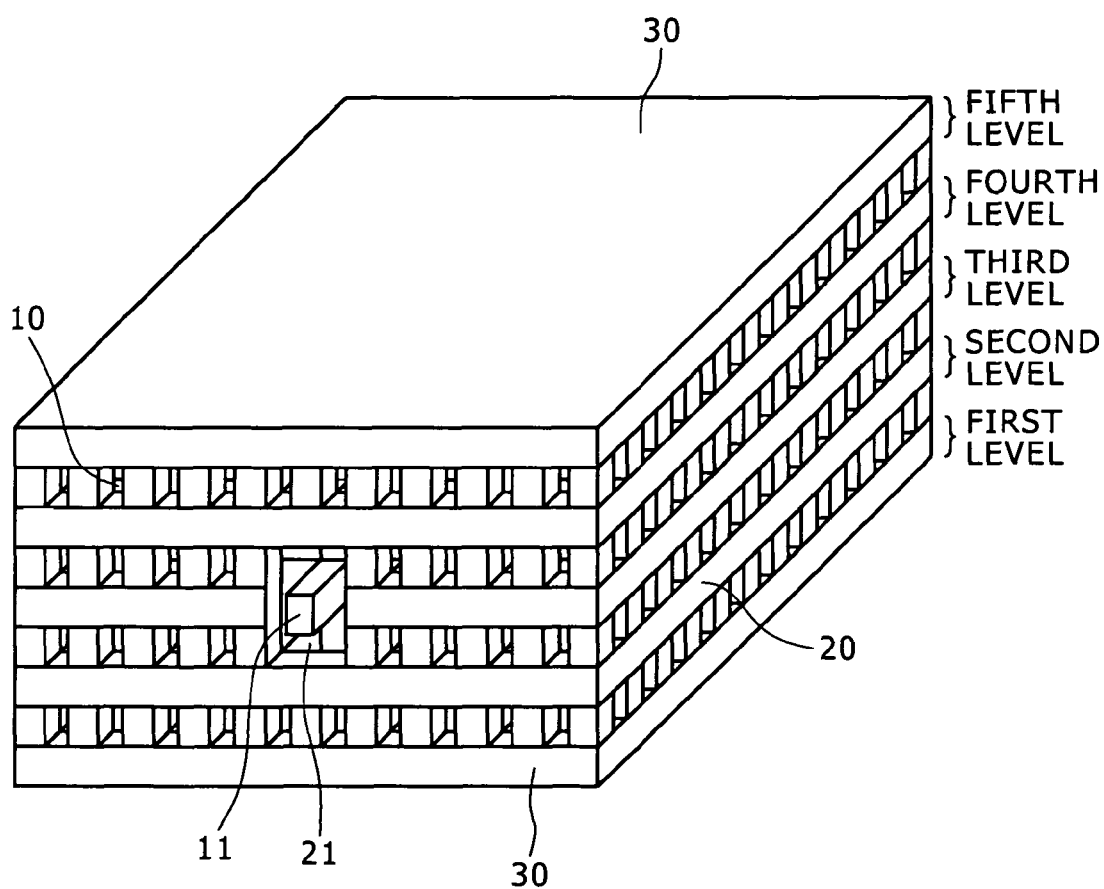
FIG. 16 is a perspective view showing a structure of a capacitative element according to a sixth embodiment of the present invention.
Figure 17A:
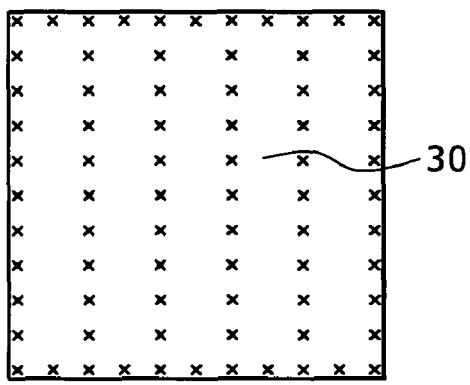
FIGS. 17A to 17E are respectively top plan views showing structures of a shielding electrode of a first level, a capacitative element layer of a second level, a capacitative element layer of a third level, a capacitative element layer of a fourth level, and a shielding electrode of the capacitative element of a fifth level of the sixth embodiment.
Figure 17B:
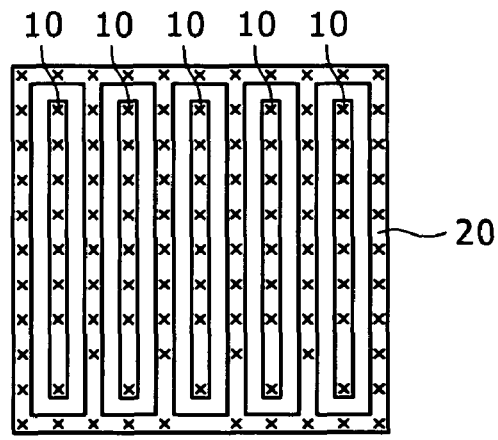
Figure 17C:
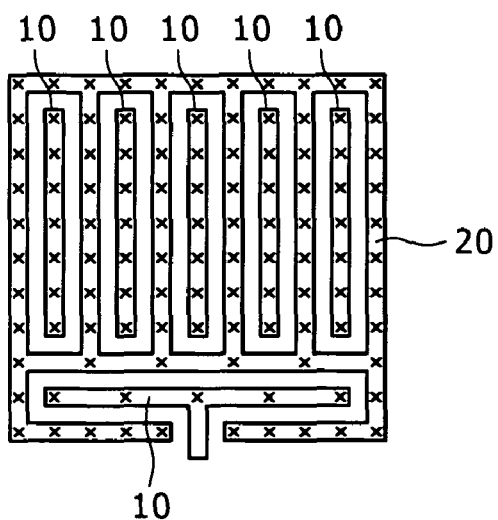
Figure 17D:
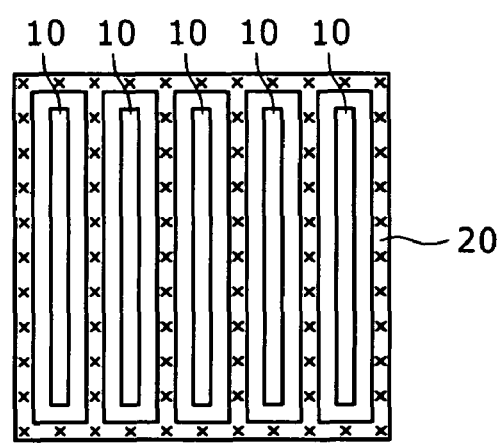
Figure 17E:
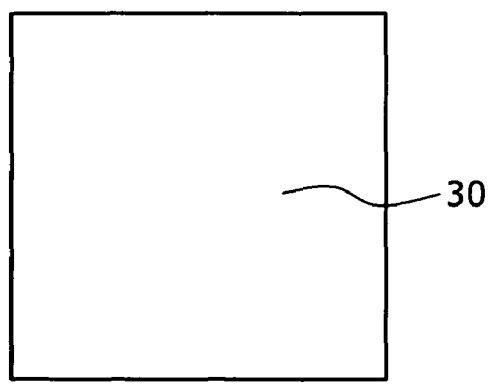

FIG. 16 is a perspective view showing a structure of a capacitative element according to a sixth embodiment, and FIGS. 17A to 17E are respectively top plan views of first to fifth levels of the capacitative element of the sixth embodiment. Specifically, FIG. 17A shows a structure of the first level of the capacitative element of the sixth embodiment, FIG. 17B shows a structure of the second level of the capacitative element of the sixth embodiment, FIG. 17C shows a structure of the third level of the capacitative element of the sixth embodiment, FIG. 17D shows a structure of the fourth level of the capacitative element of the sixth embodiment, and FIG. 17E shows a structure of the fifth level of the capacitative element of the sixth embodiment. The capacitative element of the sixth embodiment has the shielding structure which is further enhanced relative to the capacitative element of the first embodiment shown in FIG. 6 and FIGS. 7A to 7C.

That is to say, although the capacitative element of the first embodiment shown in FIG. 6 and FIGS. 7A to 7C is structured to have the first to third levels, exactly the same structure as that of the first to third levels of the capacitative element of the first embodiment is used in the second to fourth levels of the capacitative element of the sixth embodiment. Moreover, shielding electrodes 30 each making conduction with the second electrode 20 are formed in the first and fifth levels, respectively. The shielding electrode 30 is formed so as to uniformly cover the entire surface of the adjacent unit capacitative element layer. It should be noted that although the shielding electrodes 30 are formed in both the first and fifth levels of the capacitative element of the sixth embodiment, alternatively, the shielding electrode 30 may also be formed on at least one of the first and fifth levels.

Only the second electrode 20 of the second level is connected to the shielding electrode 30 of the first level through the via holes. In addition, likewise, only the second electrode 20 of the fourth level is connected to the shielding electrode 30 of the fifth level through the via holes. In such a manner, there is obtained the structure that electrical lines of force which are tried to vertically travel around the first electrodes 10 from an external terminal is perfectly shielded for the first electrodes 10 by the second electrode 20, and the capacitive coupling of the parasitic capacitance is hardly added between an external wiring and the first electrodes 10.

It should be noted that with the structure that the shielding electrodes 30 are provided in the uppermost level and the lowermost level, respectively, not only the first embodiment, but also any of the second to fifth embodiments can also be applied to the capacitative element structure between the uppermost level and the lowermost level.

The capacitative element according to the present invention can be structured as a form other than that of any of the first to sixth embodiments described above. That is to say, with regard to the connection number of unit capacitative elements in the first to sixth embodiments described above, the connection direction thereof, the lamination number of unit capacitative element layers, the positions of the via holes, and the like, the present invention is by no means limited to the first to sixth embodiments described above. In addition, although in each of the first to sixth embodiments described above, the case where the capacitative element is structured by utilizing the wiring formed on the semiconductor substrate has been described so far, the present invention is by no means limited thereto. That is to say, the present invention can also be applied to any other suitable substrate other than the semiconductor substrate. For example, the present invention can also be applied even to the case where a conductive member is formed on a glass substrate or an organic material substrate, and a capacitative element is formed by utilizing the conductive member as the electrodes. With regard to the case other than the case where the capacitative element is formed with the circuit formation using the semiconductor substrate, for example, there is given the case where a capacitative element is structured in Micro Electro Mechanical Systems (MEMS).

Effects of Embodiments

The capacitative element of any of embodiments described above is applied to an analog integrated circuit, which results in that the capacitive coupling is hardly added between the signal line and one side node of the capacitor, thereby making it possible to improve the characteristics of the analog circuit. In addition, it is possible to reduce the capacitive coupling between the adjacent capacitors.

In addition, in the existing capacitative element, a designer needs to dispose the capacitors so as to prevent addition of the coupling capacitance between the wiring and the capacitative element, and the coupling capacitance between the capacitors in the analog integrated circuit. For this reason, it is necessary to take measures to shield one side node. However, in the capacitative element of any of the embodiments described above, since the capacitative element itself has the shielding function added thereto, it is unnecessary to take the special measures to cope with the existing cases. For this reason, it is possible to reduce the chip area.

The present application contains subject matter related to that disclosed in Japanese Priority Patent Application JP 2008-229363 filed in the Japan Patent Office on Sep. 8, 2008, the entire content of which is hereby incorporated by reference.

It should be understood by those skilled in the art that various modifications, combinations, sub-combinations and alternations may occur depending on design requirements and other factors insofar as they are within the scope of the appended claims or the equivalent thereof.

What is claimed is:
1. A capacitative element, comprising:
a plurality of unit capacitative elements, wherein each of the plurality of unit capacitative elements is composed of a first electrode and a second electrode,
the first electrode being formed on a substrate;
the second electrode being provided so as to sandwich a dielectric between the first electrode and the second electrode and so as to surround the first electrode on four sides along a surface of the substrate; and
the plurality of unit capacitative elements is connected to one another along the surface of the substrate, thereby structuring layers of the plurality of unit capacitative elements,
wherein a shielding electrode making conduction with the second electrode is formed in at least one of an upper- most level and a lowermost level of the layers of the plurality of unit capacitative elements.

2. The capacitative element according to claim 1, wherein the layers of the plurality of unit capacitative elements are laminated in a direction vertical to the surface of the substrate.

3. The capacitative element according to claim 2, wherein in the layers of the plurality of unit capacitative elements laminated, the first electrodes and portions of the second electrode of each adjacent two levels make conduction with each other through via holes, respectively, provided in the direction vertical to the surface of the substrate.

4. The capacitative element according to claim 1, wherein each of the first electrode and a portion of the second electrode which are located inside each of the layers of the plurality of unit capacitive elements is surrounded on four sides along the surface of the substrate by an outermost portion of the second electrode.

5. The capacitative element according to claim 1, wherein the layers of the plurality of unit capacitative elements are laminated in a direction vertical to the surface of the substrate, are directions of the first electrodes alternately, perpendicularly intersect with each other every adjacent two levels.

6. The capacitative element according to claim 1, wherein in the layers of the plurality of unit capacitative elements, the plurality of unit capacitative elements are connected to one another in a matrix along the surface of the substrate.

7. The capacitative element according to claim 1, wherein a slot is provided in a part of one side of the second electrode, and a connection terminal is provided so as to make conduction with the first electrode through the slot.

* * * * *